United States Patent [19]

Senoo

[11] Patent Number: 5,036,191

[45] Date of Patent: Jul. 30, 1991

[54] KEY INPUT APPARATUS WITH LIGHT-SHIELDING PLATES AND LIQUID CRYSTAL SHUTTER

[75] Inventor: Seiiti Senoo, Nara, Japan

[73] Assignee: Sharp Kabushiki Kaisha, Osaka, Japan

[21] Appl. No.: 460,512

[22] Filed: Jan. 3, 1990

[30] Foreign Application Priority Data

Jan. 13, 1989 [JP] Japan ............................ 1-7109
Feb. 3, 1989 [JP] Japan ............................ 1-26041

[51] Int. Cl.$^5$ ............................................. G01D 5/34
[52] U.S. Cl. ................................... 250/229; 341/31
[58] Field of Search .................. 250/221, 229; 341/31

[56] References Cited

U.S. PATENT DOCUMENTS 3,519,116 7/1970 Koehn ............................ 250/229
3,904,870 9/1975 Stauffer ........................... 250/229
4,442,425 4/1984 Eibner ............................. 341/31

FOREIGN PATENT DOCUMENTS 60-158516 8/1985 Japan .
62-237621 10/1987 Japan .
62-274517 11/1987 Japan .
63-96826 4/1988 Japan .
1060877 3/1967 United Kingdom .

Primary Examiner—David C. Nelms

[57] ABSTRACT

A key input apparatus includes a light beam source, a plurality of input keys operable for varying the color of a light beam or intercepting a group or groups of light beams, an optical detector for detecting variations in the color of the light beam or interception of the group or groups of light beams, and a circuit for identifying operated keys based on outputs of the optical detector.

7 Claims, 8 Drawing Sheets

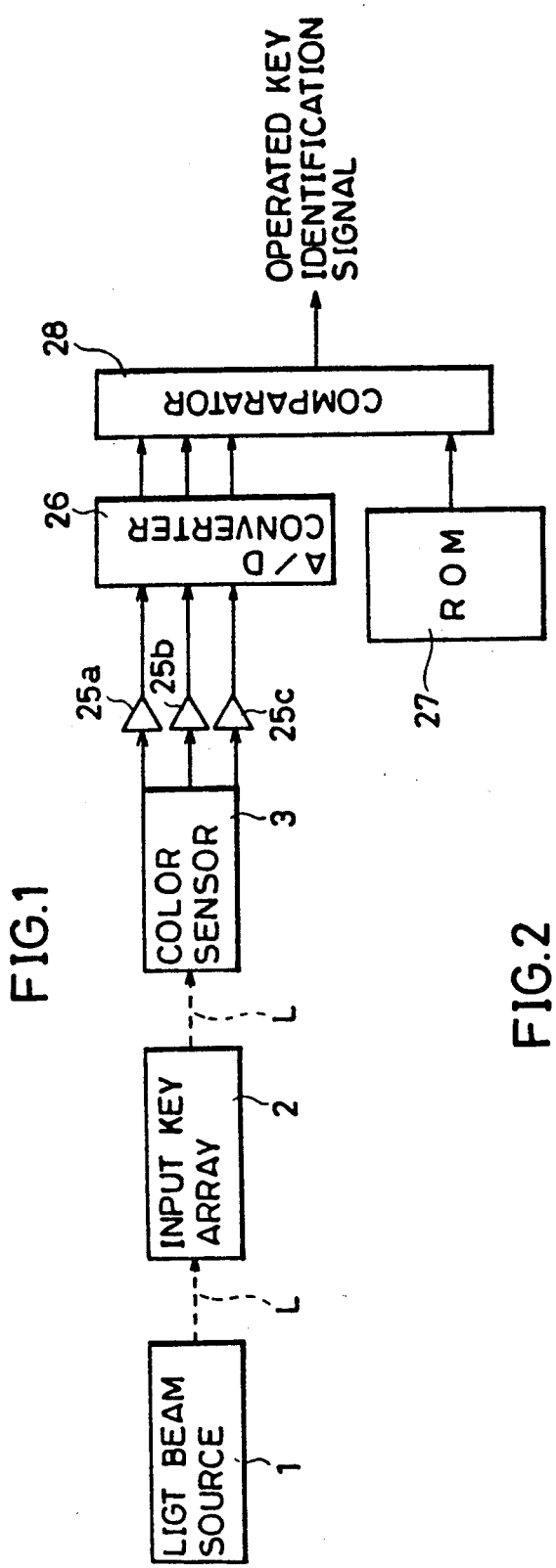
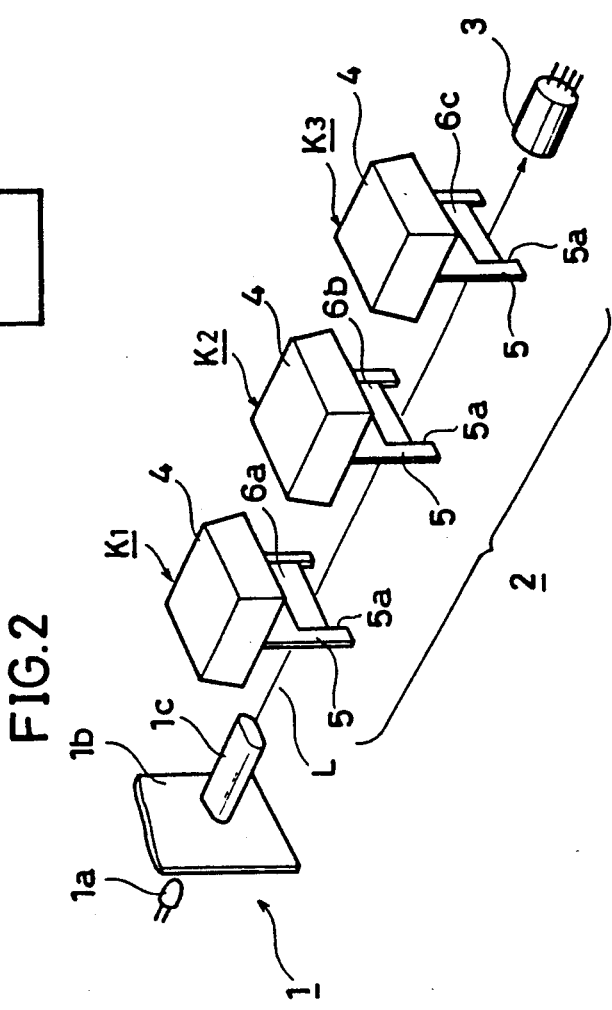

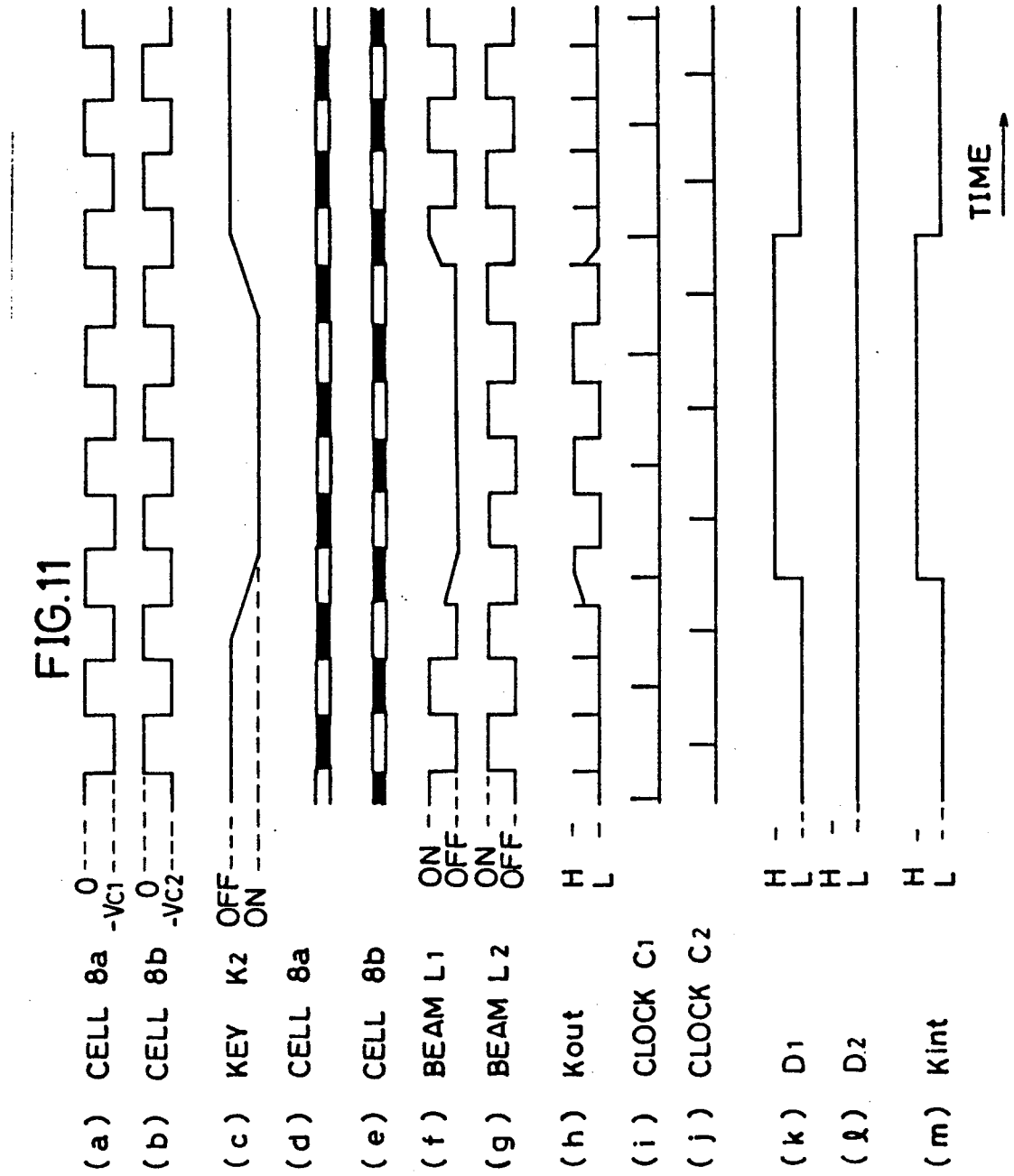

5,036,191

KEY INPUT APPARATUS WITH LIGHT-SHIELDING PLATES AND LIQUID CRYSTAL SHUTTER

BACKGROUND OF THE INVENTION

1. Field of the Invention

The present invention relates to key input apparatus and, more particularly, to key input apparatus utilizing light beams.

2. Description of the Background Art

Referring to FIG. 13 of the drawing, there is schematically shown a conventional key input apparatus. In the conventional key input apparatus, a plurality of input keys 41 are connected between an input port 44 and an output port 45 in an interface section 43. These input keys 41 comprise electric switches arranged in a matrix formed on a circuit board. Operated input keys are identified on the basis of state changes in the circuits associated therewith.

However, the conventional key input apparatus as noted above requires an expensive material for the contact of each input key 41. Further, the switching operations of the input keys 41 generate undesirable electromagnetic waves, and measures must be taken to prevent electromagnetic interference. The conventional key input apparatus, therefore, is expensive and has a complicated circuit construction in the interface section 43.

SUMMARY OF THE INVENTION

Having regard to the state of the art noted above, an object of the present invention is to provide an inexpensive key input apparatus.

Another object of the present invention is to provide a key input apparatus free from electromagnetic interference.

A further object of the invention is to provide a key input apparatus including an interface section having a simplified construction.

According to one aspect of the present invention, a key input apparatus comprises a light beam source for emitting a light beam; a plurality of input keys associated with different optical filters, respectively, each of the optical filters intersecting the light beam for attenuating a spectrum outside a particular wavelength range when the input key associated therewith is operated, the particular wavelength range assigned to a given one of the optical filters being different from the particular wavelength ranges assigned to the other optical filters; an optical detector for receiving the light beam, the optical detector outputting signals corresponding to intensify distributions relating to the spectra within the particular wavelength ranges; a memory for storing signals corresponding to predetermined various intensity distributions relating to the spectra within the particular wavelength ranges; and a comparator for identifying operated input keys by comparing the signals output from the optical detector with the signals stored in the memory.

According to another aspect of the present invention, a key input apparatus comprises a light beam source for emitting a plurality of light beams; a plurality of input keys associated with different light-shielding plates, respectively, each of the light-shielding plates intercepting a particular group of light beams including at least one of the plurality of light beams when the input key associated therewith is operated, the group of light beams intercepted by a given one of the light-shielding plates being different from groups of light beams intercepted by the other light-shielding plates; a light shutter selectively allowing passage of the plurality of light beams, one at a time, in predetermined cycles; a light deflector for deflecting the light beams having passed the light shutter to a particular point; an optical detector disposed at the particular point; and a circuit for identifying intercepted groups of light beams by sampling outputs of the optical detector in relation to the predetermined cycles, thereby identifying operated input keys.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a block diagram showing an entire key input apparatus according to one embodiment of the present invention.

FIG. 2 is a perspective view showing principal components of the key input apparatus of FIG. 1, FIG. 11 is a timing chart showing various signals relating to the key input apparatus shown in FIG. 6.

DESCRIPTION OF THE PREFERRED EMBODIMENTS

Figure 3:
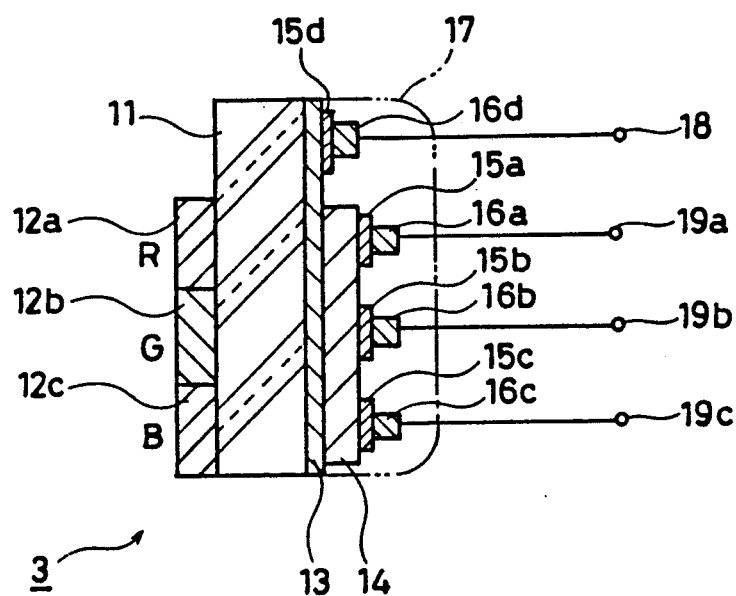
FIG. 3 is a sectional view showing details of an optical detector shown in FIG. 2.

Referring to FIG. 1, an entire key input apparatus according to the one embodiment of the present invention is schematically shown in a block diagram. In this key input apparatus, a light beam source 1 emits a light beam L. An input key array 2 includes a first, a second and a third input keys K1, K2 and K3 arranged in series along the light beam L, these input keys having different color filters, respectively. A color sensor 3 detects spectral intensities of R (red), G (green) and B (blue) in the light beam L. Outputs of the color sensor 3 corresponding to the spectral intensities of R, G and B are amplified by amplifiers 25a, 25b and 25c, respectively. Outputs of the amplifiers 25a, 25b and 25c are input through an A/D (analog/digital) converter 26 to a comparator 28 for comparison with various spectral intensity distributions stored in a ROM (Read-Only Memory) 27. An operated input key is identified on the basis of the comparison with the various spectral intensity distributions, and an input key identification signal is output from the comparator 28.

Referring to FIG. 2, mutual relations among principal components of the light beam source 1, input key array 2 and color sensor 3 are shown in greater detail in a perspective view. The light beam source 1 includes a light source 1a, a light shield 1b and a light tube 1c. The light beam L is emitted through the light tube 1c, and the light that does not enter the light tube 1c is blocked by the light shield 1d. Each of the first, second and third input keys K1, K2 and K3 arranged along the light beam L includes a key button 4 and a vertical plate 5 depending therefrom. Each vertical plate 5 defines a cutout 5a. The cutout 5a of the first input key K1 is fitted with a red color filter 6a for attenuating light outside the wavelength range of read. The cutout 5a of the second input key K2 is fitted with a green color filter 6b for attenuating light outside the wavelength range of green. The cutout 5a of the third input key K3 is fitted with a blue color filter 6c for attenuating light outside the wavelength range of blue.

Thus, when the first input key K1 is depressed, the light beam L having passed through the red color filter 6a impinges upon the color sensor 3. When the second input key K2 is depressed, the light beam L having passed through the green color filter 6b impinges upon the color sensor 3. Further, when the third input key K3 is depressed, the light beam L having passed through the blue color filter 6c impinges upon the color sensor 3. On the other hand, when none of the input keys are depressed, the light beam L emitted from light beam source 1 impinges directly upon the color sensor 3.

Referring to FIG. 3, the construction of the color sensor 3 is shown in greater detail in a sectional view. In this color sensor 3 of the integrated type, a glass base 11 carries a red color filter 12a, a green color filter 12b and a blue color filter 12c mounted on a front face or light impinging side thereof. On the rear face of the glass base 11 is a front electrode 13 comprising a transparent conductive layer, with amorphous silicon layer 14 formed on the front electrode 13. On the amorphous silicon layer 14 are three metallic rear electrodes 15a, 15b and 15c formed at positions opposed to the three color filters 12a, 12b and 12c, respectively. Also on the front electrode 13a is formed a metallic electrode 15d. On the respective metallic electrodes 15a, 15b, 15c and 15d are lead frames 16a, 16b, 16c and 16d. The common front electrode 13 is connected to a terminal 18 through the metallic electrode 15d and lead frame 16d. The rear metallic electrodes 15a, 15b and 15c are connected to terminals 19a, 19b and 19c through the lead frames 16a, 16b and 16c, respectively. The rear face of the color sensor 3 is sealed by a resin coating 17.

Figure 4:
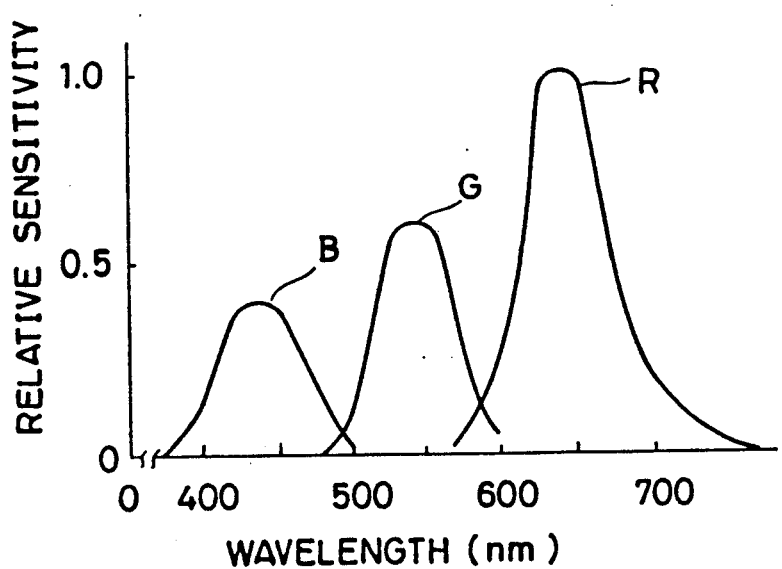
FIG. 4 is a graph showing a spectral sensitivity characteristics of the optical detector shown in FIG. 3, FIGS. 5A, 5B and 5C are graphs showing spectral intensity distributions in light beams having passed through various optical filters.

Referring to FIG. 4, a spectral sensitivity characteristic of the color sensor 3 of FIG. 3 is shown. The axis of abscissas represents wavelength, while the axis of ordinates represents relative sensitivity. As seen, the color sensor 3 of FIG. 3 has sensitivity peaks within the three wavelength ranges of R, G and B. This spectral sensitivity characteristic corresponds to the case where none of the input keys K1, K2 and K3 are depressed and the light beam L emitted from the light beam source 1 impinges directly upon the color sensor 3. At this time, the amplifiers 25a, 25b and 25c output $V_R$, $V_G$ and $V_B$, respectively, as typically shown in Table 1, in accordance with the spectral sensitivities of R, G and B in the color sensor 3.

TABLE 1

| Outputs | Volts |
|---------|-------|
| $V_R$   | 10.00 |
| $V_G$   | 6.00  |
| $V_B$   | 4.00  |

Consequently, these output voltages $V_R$, $V_G$ and $V_B$ are compared at the comparator 28 with voltage levels stored in the ROM 27. When the conditions $V_R > 9.00$, $V_G > 5.00$ and $V_B > 3.00$ are met, it is determined that none of the input keys K1, K2 and K3 are depressed.

Figure 5A:
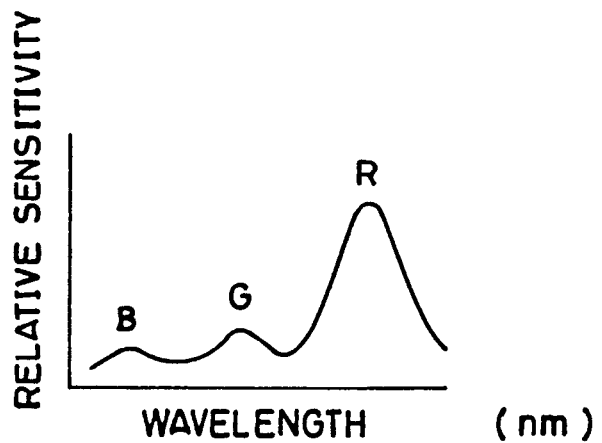

Referring to FIG. 5A, the spectral sensitivity of the color sensor 3 of FIG. 3 is shown, which occurs with depression of the first input key K1. That is, the light beam L emitted from the light beam source 1 passes through the red color filter 6a, whereby light outside the wavelength range of red becomes attenuated. In FIG. 5A, therefore, the peaks in the spectral intensities of G and B are lower than those in FIG. 4. Typical voltages $v_R$, $V_G$ and $V_B$ output from the respective amplifiers 25a, 25b and 25c at this time are shown in Table 2.

TABLE 2

| Outputs | Volts |
|---------|-------|
| $V_R$   | 9.00  |
| $V_G$   | 3.00  |
| $V_B$   | 1.00  |

Consequently these output voltages $V_R$, $V_G$ and $V_B$ are compared with the voltages levels stored in the ROM 27. When the conditions $5.00 < V_R < 11.00$, $0.00 < V_G < 4.00$ and $0.00 < V_B < 2.00$ are met, it is determined that the input key K1 is operated.

Figure 5B:
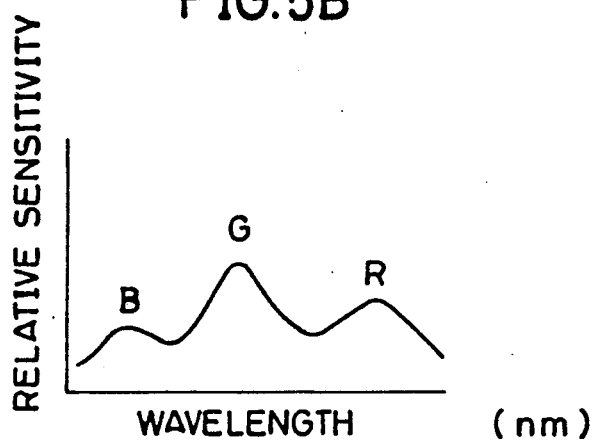

Referring to FIG. 5B, the spectral sensitivity of the color sensor 3 is shown, which occurs with depression of the second input key K2. That is, the light beam L emitted from the light beam source 1 passes through the green color filter 6b, whereby light outside the wavelength range of green becomes attenuated. In FIG. 5B, therefore, the peaks in the spectral intensities of R and B are lower than those in FIG. 4. Typical voltages $v_R$, $V_G$ and $V_B$ output from the respective amplifiers 25a, 25b and 25c at this time are shown in Table 3.

TABLE 3

| Outputs | Volts |
|---------|-------|
| $V_R$   | 4.00  |
| $V_G$   | 5.00  |
| $V_B$   | 1.00  |

Consequently, these output voltages $V_R$, $V_G$ and $V_B$ are compared with the voltages levels stored in the ROM 27. When the conditions $0.00 < V_R < 5.00$, $4.00 < V_G < 7.00$ and $0.00 < V_B < 2.00$ are met, it is determined that the input key K2 is operated.

Figure 5C:
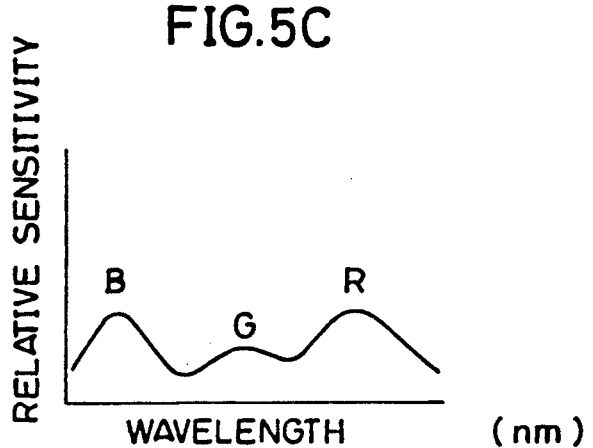

Referring to FIG. 5C, the spectral sensitivity of the color sensor 3 is shown, which occurs with depression of the third input key K3. That is, the light beam L emitted from the light beam source 1 passes through the blue color filter 6c, whereby light outside the wavelength range of blue becomes attenuated. In FIG. 5C, therefore, the peaks in the spectral intensities of R and G are lower than those in FIG. 4. Typical voltages $V_R$, $V_G$ and $V_B$ output from the respective amplifiers 25a, 25b and 25c at this time are shown in Table 4.

TABLE 4

| Outputs | Volts |
| --- | --- |
| $V_R$ | 3.00 |
| $V_G$ | 2.00 |
| $V_B$ | 3.00 |

Consequently, these output voltages $V_R$, $V_G$ and $V_B$ are compared with the voltages levels stored in the ROM 27. When the conditions $0.00 < V_R < 5.00$, $0.00 < V_G < 4.00$ and $2.00 < V_B < 5.00$ are met, it is determined that the input key K3 is operated.

In this way, it is determined whether any of the input keys K1, K2 and K3 is depressed or not, and an input key identification signal is output from the comparator 28.

Figure 6:
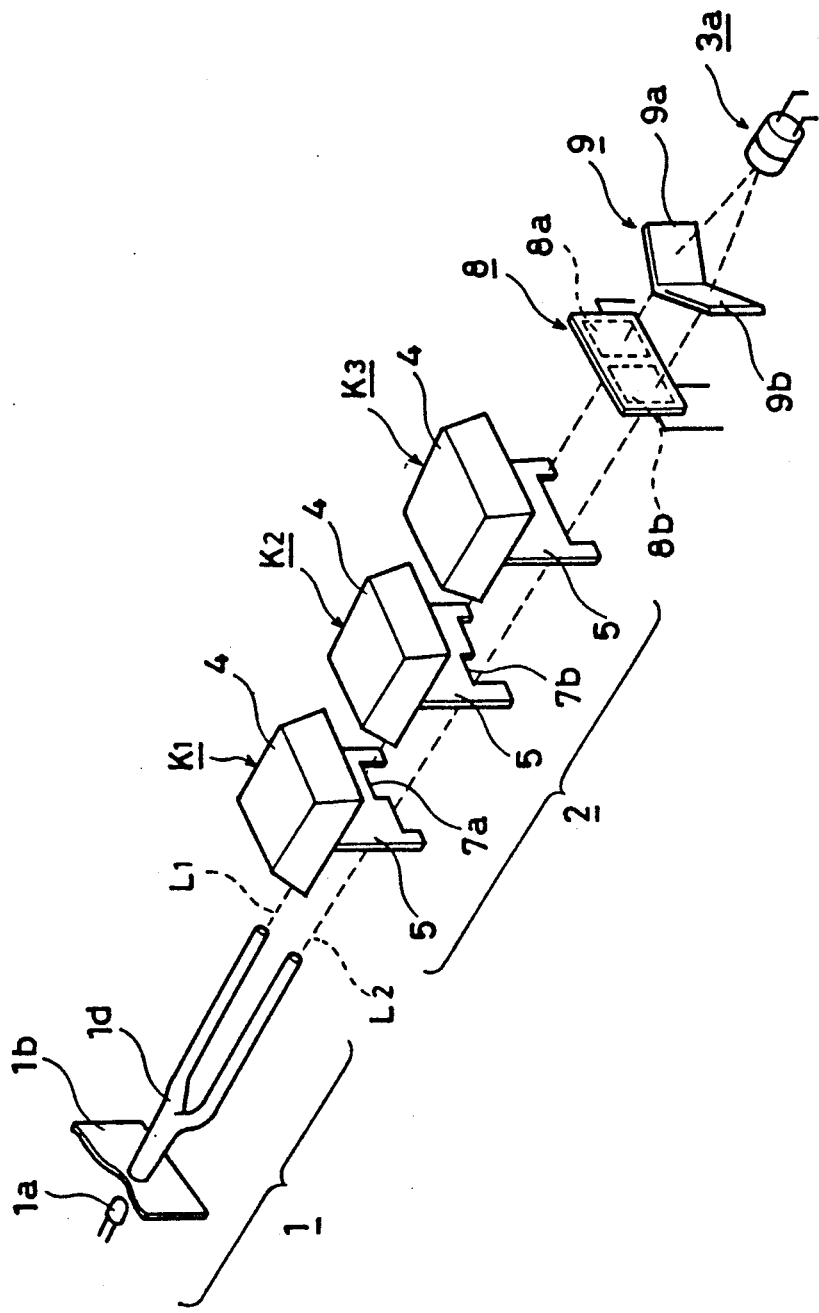
FIG. 6 is a perspective view showing principal components of a key input apparatus according to another embodiment of the present invention.

Referring to FIG. 6, principal components of a key input apparatus according to another embodiment of the present invention are shown in a perspective view. A light beam source 1 includes a light source 1a, a light shield 1b and a light tube 1d. The light tube 1d comprises a bifurcated tube for emitting a first and a second light beams L1 and L2 parallel to each other. Each of a first, a second and a third input keys K1, K2 and K3 arranged along the light beams L1 and L2 includes a key button 4 and an opaque vertical plate 5 depending therefrom. The vertical plate 5 of the first input key K1 defines a cutout 7a for allowing passage of the first light beam L1 at all times. The vertical plate 5 of the second input key K2 defines a cutout 7b for allowing passage of the second light beam L2 at all times. However, the vertical plate 5 of the third input key K3 does not define a cutout for allowing passage of the first light beam L1 or second light beam L2.

Figure 7A:
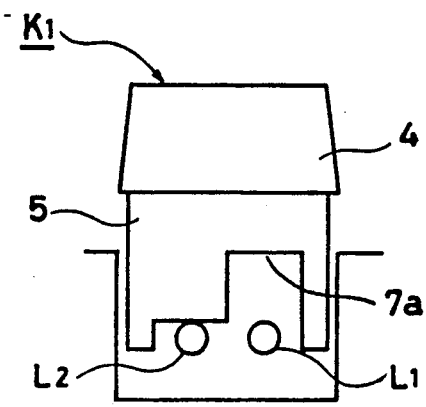
FIGS. 7A, 7B, 8A, 8B, 9A and 9B are explanatory views showing operations of input keys in the key input apparatus shown in FIG. 6, FIGS. 10A, 10B and 10C are explanatory views showing an operation of the key input apparatus shown in FIG. 6.
Figure 7B:
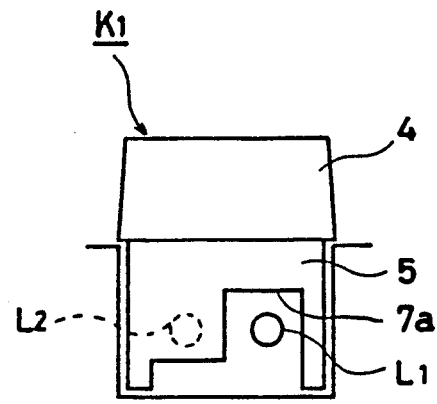
Figure 8A:
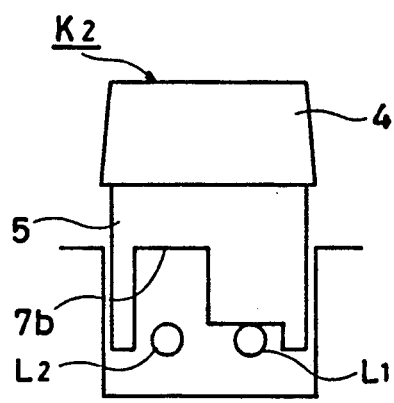
Figure 8B:
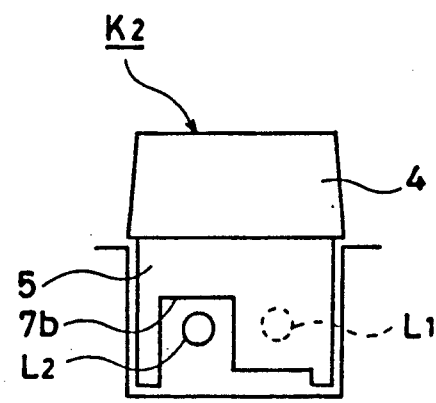
Figure 9A:
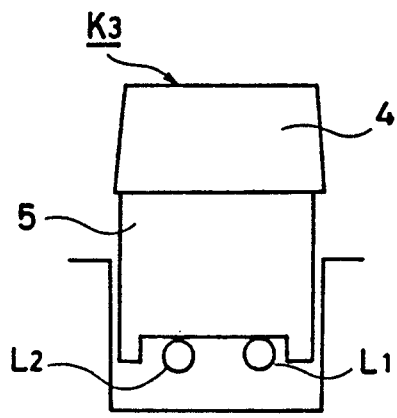
Figure 9B:
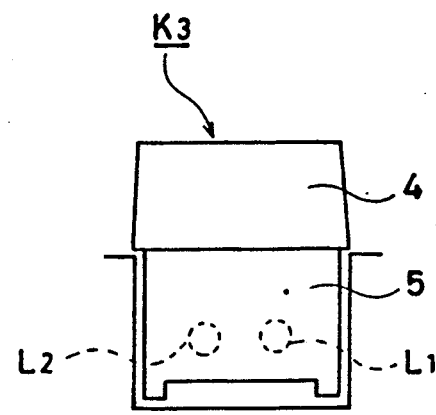

As more clearly shown in FIGS. 7A and 7B, when the first input key K1 is depressed, the second light beam L2 is blocked by the vertical plate 5 but the first light beam L1 passes through the cutout 7a. On the other hand, as seen from FIGS. 8A and 8B, when the second input key K2 is depressed, the first light beam L1 is blocked by the vertical plate 5 but the second light beam L2 passes through the cutout 7b. However, as seen from FIGS. 9A and 9B, when the third input key K3 is depressed, both the first and second light beams L1 and L2 are blocked by the vertical plate 5.

As shown in FIG. 6, a light shutter 8 is provided for alternately intercepting the first and second light beams L1 and L2 in cycles. The light shutter 8 includes a first and a second liquid crystal cells 8a and 8b. The first liquid crystal cell 8a is electrically operable for intercepting the first light beam L1 in cycles. The second liquid crystal cell 8b is electrically operable in opposite phase to the first liquid crystal cell 8b for intercepting the second light beam L2 in cycles.

The light beams L1 and L2 having passed through the light shutter 8 impinge upon a prism 9. The prism 9 includes a first and a second prism portions 9a and 9b for deflecting the respective light beams L1 and L2 to a light sensor 3a. The light sensor 3a includes a phototransistor.

Figure 10A:
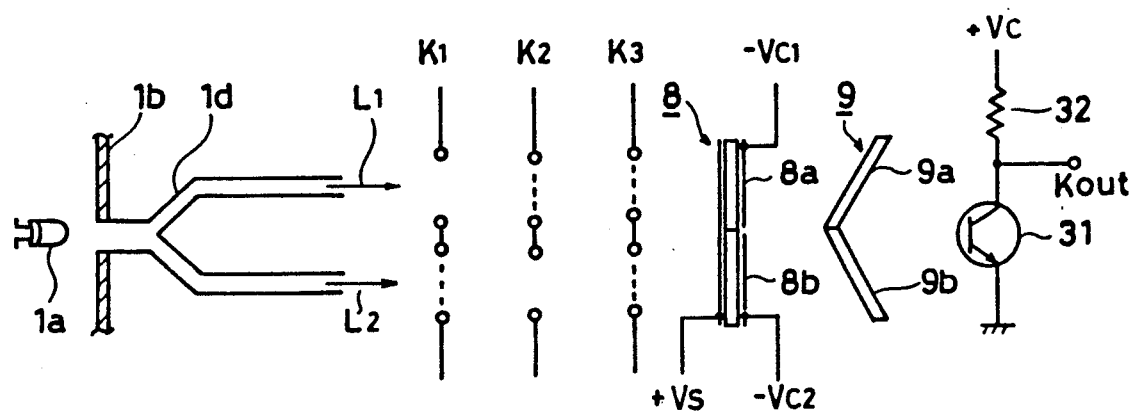
Figure 10B:
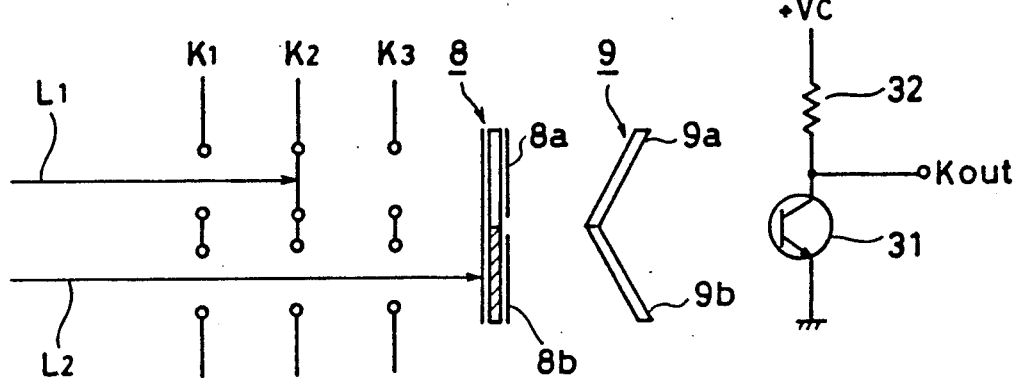
Figure 10C:
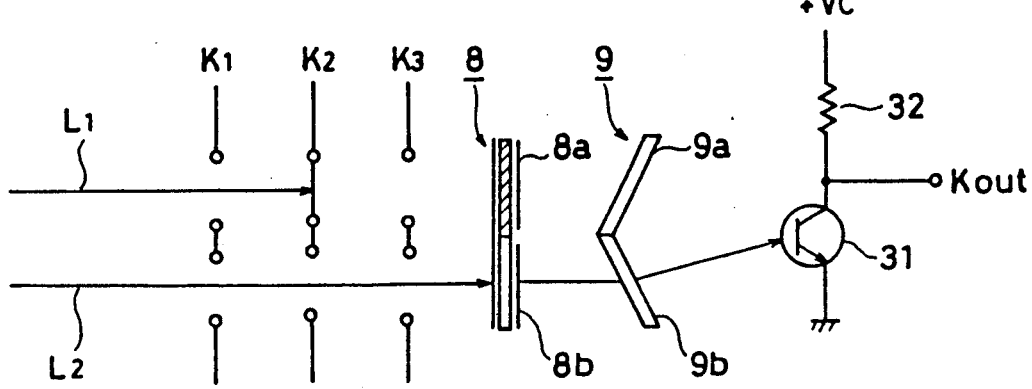

Referring to FIGS. 10A through 10C, an operation of the key input apparatus of FIG. 6 is exemplified therein. Reference will also be made to FIG. 11 showing relations in timing among various signals occurring with the operation of the key input apparatus of FIG. 6. FIG. 10A shows a state where none of the input keys K1, K2 and K3 are depressed. The first liquid crystal cell 8a of the light shutter 8 is applied with a voltage $-Vc_1$ cyclically at constant intervals as shown in FIG. 11 (a). The liquid crystal cell 8a is normally transparent, and becomes opaque only when the voltage $-Vc_1$ is applied thereto. That is, in FIG. 11 (d), the liquid crystal cell 8a is transparent during the periods marked white, and opaque during the periods marked black. Similarly, the second liquid crystal cell 8b is applied with a voltage $-Vc_2$ cyclically at constant intervals as shown in FIG. 11 (b). However, the phase in which the voltage $-Vc_2$ is applied is opposite to that of voltage $-Vc_1$. Consequently, as seen from FIGS. 11 (d) and (e), the second liquid crystal cell 8b is transparent while the first liquid crystal cell 8a is opaque, and opaque while the first liquid crystal cell 8a is transparent.

When none of the input keys K1, K2 and K3 are depressed as shown in FIG. 10A, either of the first and second light beams L1 and L2 impinges upon a phototransistor 31 in the light sensor 3a. The collector of phototransistor 31 is connected to a DC source +Vc through a current limiting resistor 32, while the emitter thereof is grounded. Thus, the light sensor 3a provides an "L" (low) level output through an output terminal Kout when the phototransistor 31 receives either of the light beams L1 and L2, and an "H" (high) level output when the phototransistor 31 receives neither of the light beams L1 and L2. In other words, whether either of the light beams L1 and L2 has reached the phototransistor 31 or not is expressed by a digital electric signal of binary logic.

When, for example, the second input key K2 is depressed as shown in FIGS. 10B and 10C, the first light beam L is blocked by the vertical plate 5 of the second input key K2, but the second light beam L2 travels through the cutout 7b to the light shutter 8. If, at this time, the second liquid crystal cell 8b of the shutter 8 is in an opacity period, the second light beam L2 is intercepted by the shutter 8 as shown in FIG. 10B. In the state shown in FIG. 10B, therefore, the light sensor 3a provides the "H" level output. However, if the second liquid crystal cell 8b is in a transparency period, as shown in FIG. 10C, the second light beam L2 reaches the phototransistor 31, whereby the light sensor 3a provides the "L" level output.

That is, when the second input key K2 is depressed to an ON state as shown in FIG. 11 (c), intensities of the first and second light beams L1 and L2 on a light receiving plane of the phototransistor 31 vary as shown in FIGS. 11 (f) and (g), respectively. Consequently, while the second input key K2 is depressed, the light sensor 3a outputs a waveform signal as shown in FIG. 11 (h), which is at "H" level during the opacity periods of the second liquid crystal cell 8b.

Figure 12:
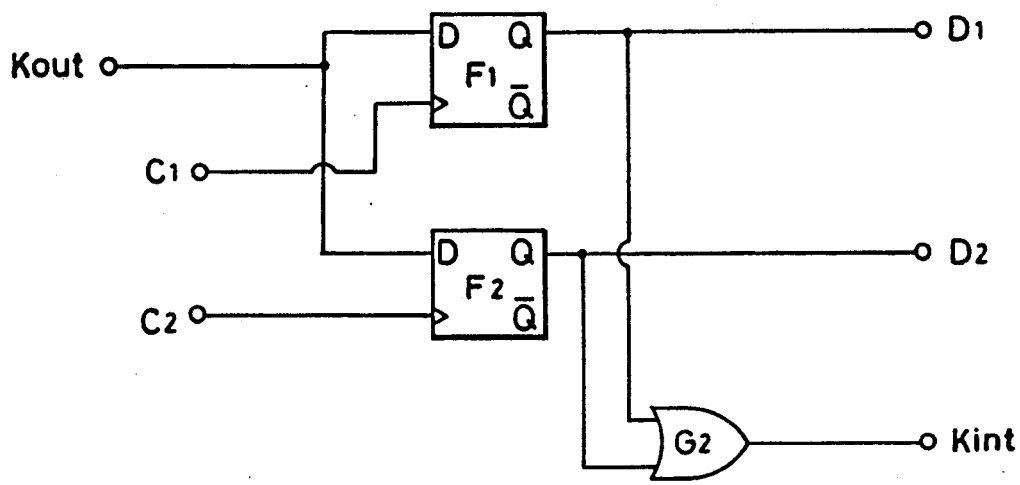
FIG. 12 is a block diagram showing a circuit for identifying operated keys in the key input apparatus shown in FIG. 6.
Figure 13:
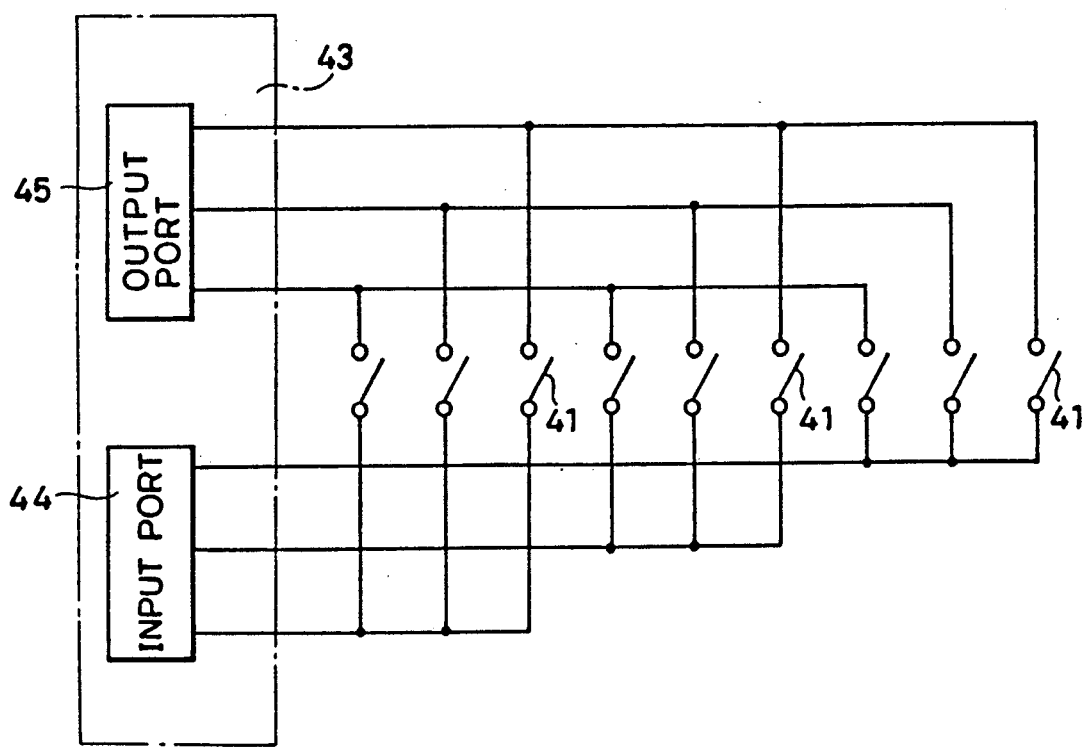
FIG. 13 is a circuit diagram schematically showing a conventional key input apparatus.

Referring to FIG. 12, an interface circuit acting as an input key identifying device is shown in a block diagram. The output Kout of the light sensor 3a is connected to data inputs of both of a first and a second flip-flops F1 and F2 in this interface circuit. The first and second flip-flops F1 and F2 include trigger inputs, respectively, for receiving a first sampling clock signal C1 synchronized with the transparency periods of the first liquid crystal cell 8a and a second sampling clock signal C2 synchronized with the transparency periods of the second liquid crystal cell 8b to determine whether or not the light sensor 3a has received either of the first and second light beams L1 and L2. These first and second sampling clock signals C1 and C2 are shown in FIGS. (i) and (j).

Thus, when the second input key K2 is depressed, the periods in which the output Kout of the light sensor 3a becomes "H" level are synchronized with the first sampling clock signal C1 as seen from FIGS. 11 (h) and (i), and therefore output D1 of the first flip-flop F1 becomes "H" level as shown in FIG. 11 (k). However, as seen from FIGS. 11 (h) and (j), the second sampling clock signal C2 is synchronized with the "L" level periods of the output Kout of the light sensor 3a, and therefore output D2 of the second flip-flop F2 remains at "L" level as shown in FIG. 11 (l). The outputs D1 and D2 of the flip-flops F1 and F2 are input also to an OR gate G2 in FIG. 12. Consequently, the OR gate G2 raises an interrupt signal Kint to "H" level for transmission to a computer (not shown), whereby the computer identifies the operated second input key K2 from 2-bit information including the "H" level output signal D1 and "L" level output signal D2 of the flip-flops F1 and F2.

It will be understood that, when the input key K1 is depressed, on the other hand, the output D1 of the first flip-flop F1 remains at "L" level while the output D2 of the second flip-flop F2 becomes "H" level. Consequently, the computer is able to identify the operated first input key K1. It will be understood further that, when the third input key K3 is depressed, the outputs D1 and D2 of the first and second flip-flops F1 and F2 become "H" level. Thus, the computer is able to identify the operated third input key K3 also. However, when none of the first, second and third input keys K1, K2 and K3 and depressed, the outputs D1 and D2 of the first and second flip-flops F1 and F2 both remain at "L" level. Consequently, the interrupt signal Kint output from the OR gate G2 remains at "L" level, and the computer need not identify any input key K1, K2 or K3.

Table 5 summarizes the corresponding relations between the outputs D1 and D2 of flip-flops F1 and F2 and the input keys K1, K2 and K3 as operated.

TABLE 5

| D1 | D2 | Input Keys |
|----|----|-----------|
| L  | L  | —         |
| L  | H  | K1        |
| H  | L  | K2        |
| H  | H  | K3        |

As described above, the key input apparatus according to the present invention identify operated input keys based on state changes in the light beam or beams, and therefore do not require an array of electric switches as in the conventional apparatus. Thus, the present invention does not require an expensive contact material, thereby providing a key input apparatus at a low cost.

The key input apparatus according to the present invention are free from the electromagnetic interference due to the electric switches as encountered in the conventional apparatus. Thus, there is no need for a measure to prevent the electromagnetic interference, thereby realizing a still lower manufacturing cost.

Moreover, the input key array may be separated from an electronic circuit portion with ease since the interface of the three input keys may be formed of one light beam source and one optical detector.

While the foregoing embodiments have been described in relation to key input apparatus each including only three input keys, it will readily be understood that the present invention is applicable also to a key input apparatus including a key array with a larger number of keys arranged on a two-dimensional plane.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A key input apparatus comprising:
    a light beam source for emitting a plurality of light beams,
    a plurality of input keys associated with different light-shielding plates, respectively, each of said light-shielding plates intercepting a particular group of light beams including at least one of said plurality of light beams when the input key associated therewith is operated, the group of light beams intercepted by a given one of said light-shielding plates being different from groups of light beams intercepted by the other light-shielding plates,
    light shutter means selectively allowing passage of said plurality of light beams, one at a time, in predetermined cycles said light shutter means includes a plurality of liquid crystal cells, electric signals being applied to said liquid crystal cells for selecting said liquid crystal cells, one at a time, in said predetermined cycles, only one selected liquid crystal cell becoming transparent for a predetermined period,
    light deflector means for deflecting the light beams having passed said light shutter means to a particular point,
    optical detecting means disposed at said particular point, and
    circuit means for identifying intercepted groups of light beams by sampling outputs of said optical detecting means in relation to said predetermined cycles, thereby identifying operated input keys.

2. A key input apparatus as claimed in claim 1, wherein said light beam source includes a light source, a branched light tube for receiving a light from said light source and emitting said plurality of light beams, and a light shield for shielding other light than the light travelling from said light source into said light tube.

3. A key input apparatus as claimed in claim 1, wherein each of said light-shielding plates defines at least one cutout for allowing passage of a light beam other than those included in the groups of light beams to be intercepted.

4. A key input apparatus as claimed in claim 1, wherein said deflector means includes at least one prism.

5. A key input apparatus as claimed in claim 1, wherein said optical detecting means includes a phototransistor.

6. A key input apparatus as claimed in claim 5, wherein said optical detecting means is operable for normally outputting a high level signal, and outputting a low level signal upon receipt of light.

7. A key input apparatus as claimed in claim 1, wherein said circuit means includes a plurality of flip-flops, an output of said optical detecting means being connected commonly to data inputs of all of said flip-flops, each of said flip-flops having a trigger input for receiving a sampling clock signal corresponding to the selection of one of said liquid crystal cells.

* * * * *